United States Patent
Kliman et al.

(10) Patent No.: US 6,236,227 B1
(45) Date of Patent: *May 22, 2001

(54) METHOD AND APPARATUS FOR TURN FAULT DETECTION IN MULTI-PHASE AC MOTORS

(75) Inventors: Gerald Burt Kliman, Niskayuna, NY (US); Thomas Gerard Habetler, Snellville; Marcus Alex Cash, Atlanta, both of GA (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/121,714

(22) Filed: Jul. 24, 1998

Related U.S. Application Data

(62) Division of application No. 08/958,234, filed on Oct. 27, 1997.
(60) Provisional application No. 60/048,904, filed on Jun. 6, 1997.

(51) Int. Cl.[7] .................................................. G01R 31/06
(52) U.S. Cl. .......................................... 324/772; 324/545
(58) Field of Search .................................. 324/522, 772, 324/545

(56) References Cited

U.S. PATENT DOCUMENTS

| | | | |
|---|---|---|---|
| 4,133,017 | 1/1979 | Johnson et al. | 361/42 |
| 4,445,080 | * 4/1984 | Curtiss | 324/772 X |
| 4,724,373 | * 2/1988 | Lipo | 324/772 X |
| 4,858,057 | 8/1989 | Maier et al. | 361/94 |
| 4,937,530 | * 6/1990 | Vogt et al. | 324/545 |
| 5,252,915 | 10/1993 | Sedding et al. | 324/158 MG |
| 5,270,640 | 12/1993 | Kohler et al. | 324/158 MG |
| 5,477,163 | 12/1995 | Kliman | 324/772 |
| 5,514,978 | 5/1996 | Koegl et al. | 324/772 |
| 5,612,601 | 3/1997 | Kueck et al. | 318/449 |
| 5,786,708 | 7/1998 | Premerlani et al. | 324/772 |
| 6,043,664 | * 3/2000 | Kliman et al. | 324/545 |

OTHER PUBLICATIONS

"Instantaneous Power as a Medium for the Signature Analysis of Induction Motors" by SF Legowski, et al, IEEE Transactions on Industry Applications, vol. 32, No. 4, Jul./Aug. 1996, pp. 904–909.

"Protection of Squirrel–Cage Induction Motor Utilizing Instantaneous Power and Phase Information" by Reinhad Maier, IEEE Trans. on Industry Applications, vol. 28, No. 2 Mar./Apr. 1992, pp. 376–380.

* cited by examiner

*Primary Examiner*—Glenn W. Brown
(74) *Attorney, Agent, or Firm*—Ann M. Agosti; Jill M. Breedlove

(57) ABSTRACT

A method for turn fault detection in a multi-phase alternating current machine includes obtaining instantaneous line-to-neutral voltages from each phase of the machine, calculating the sum of the line-to-neutral voltages, and using the sum to determine whether a turn fault exists. The line-to-neutral voltages can be filtered to reduce harmonics. In one embodiment, deviations in a time-averaged function of the sum are examined. The time-averaged function can be exponentially weighted. Each of the line-to-neutral voltages can be calibrated to remove inherent machine phase impedance imbalance prior to calculating the sum of the line-to-neutral voltages.

2 Claims, 1 Drawing Sheet

METHOD AND APPARATUS FOR TURN FAULT DETECTION IN MULTI-PHASE AC MOTORS

This application is a division of application Ser. No. 08/958,234, filed Oct. 27, 1997, which is hereby incorporated by reference in its entirety which claims benefit of Provisional No. 60/048,904 filed Jun. 6, 1997.

BACKGROUND OF THE INVENTION

The present invention relates generally to detecting turn faults in the stator of an alternating current (AC) machine.

Stator turn-to-turn shorts are one of the more prevalent and potentially destructive electrical faults in inverter-driven AC machines such as induction motors, for example. Arising primarily from insulation degradation (through contamination or abnormal thermal, mechanical, electrical or other environmental stresses), these localized faults produce thermal hot spots that foster progressive degradation that can mature into turn-to-ground faults. On-line detection of early stages of electrical failure modes is crucial to promoting safe and economical use of induction motors in industrial applications. Economic efficiency of turn fault detection is of prime concern, particularly on small machines where little resources can be allocated for motor monitoring and where a monitoring device or system has to operate in a stand-alone mode. To best preserve the stator, a marketable system should be able to detect a motor fault and subsequently interrupt the power within a minimum number of cycles of the electrical excitation. For larger machines where the potential damage is greater, fractions of a cycle under fault can translate into great financial losses.

Pre-processing data in an intelligence-based scheme requires expensive and inconvenient levels of data collection and creates a susceptibility to false alarms that arise from failure to learn the entire operating regime. A candidate detection scheme should avoid extensive reliance upon real-time comparisons to learned conditions that may not incorporate all acceptable and unacceptable machine states. Furthermore, such elaborate intelligence-based schemes usually depend upon more expensive digital signal processing hardware that can limit their marketability in smaller or remote machines.

In addition to signal processing hardware, another physical consideration involves sensors. As practicality and economic constraints discourage the use of delicate machine-embedded devices, the only inherent and readily accessible alternative sources of information regarding a machine's health are the machine's terminal voltages and currents. Conventional machine monitoring techniques with machine terminal currents and voltages require significant digital signal processing power. A common example for turn fault detection is the decomposition and subsequent analysis of the three phase currents and voltages into the positive, negative, and zero sequence values. Such turn fault detection techniques include algorithms that focus on monitoring the negative sequence voltage and current which arise from unbalanced machine operation and/or unbalanced windings. Harmonics and frequency variations can interfere with accurate negative sequence value calculations.

SUMMARY OF THE INVENTION

It is therefore seen to be desirable to provide a reliable and economical method for turn fault detection that is insensitive to harmonics and frequency deviations and that can be accomplished with inexpensive, compact, and rugged analog or digital hardware. In the present invention, the algebraic sum of three instantaneous line-neutral voltages is used to readily identify the occurrence of a turn fault.

Because the algebraic sum includes frequency components due to stator core magnetic saturation and slot harmonics, for example, the detection sensitivity can be improved by removal of these frequencies by band-pass filtering the instantaneous line-neutral voltages around the fundamental. The present invention relies on deviations in phase impedance balance occurring during turn faults and not on changes in average phase impedance values (attributable to differing normal operating conditions) and is thus largely immune to varying load conditions, operating temperatures, and source voltage perturbations. The simplicity of this technique provides a low-cost analog or digital implementation wherein a turn fault can be reliably detected within a single cycle of the fundamental machine excitation.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENTS OF THE INVENTION

Figure 1:
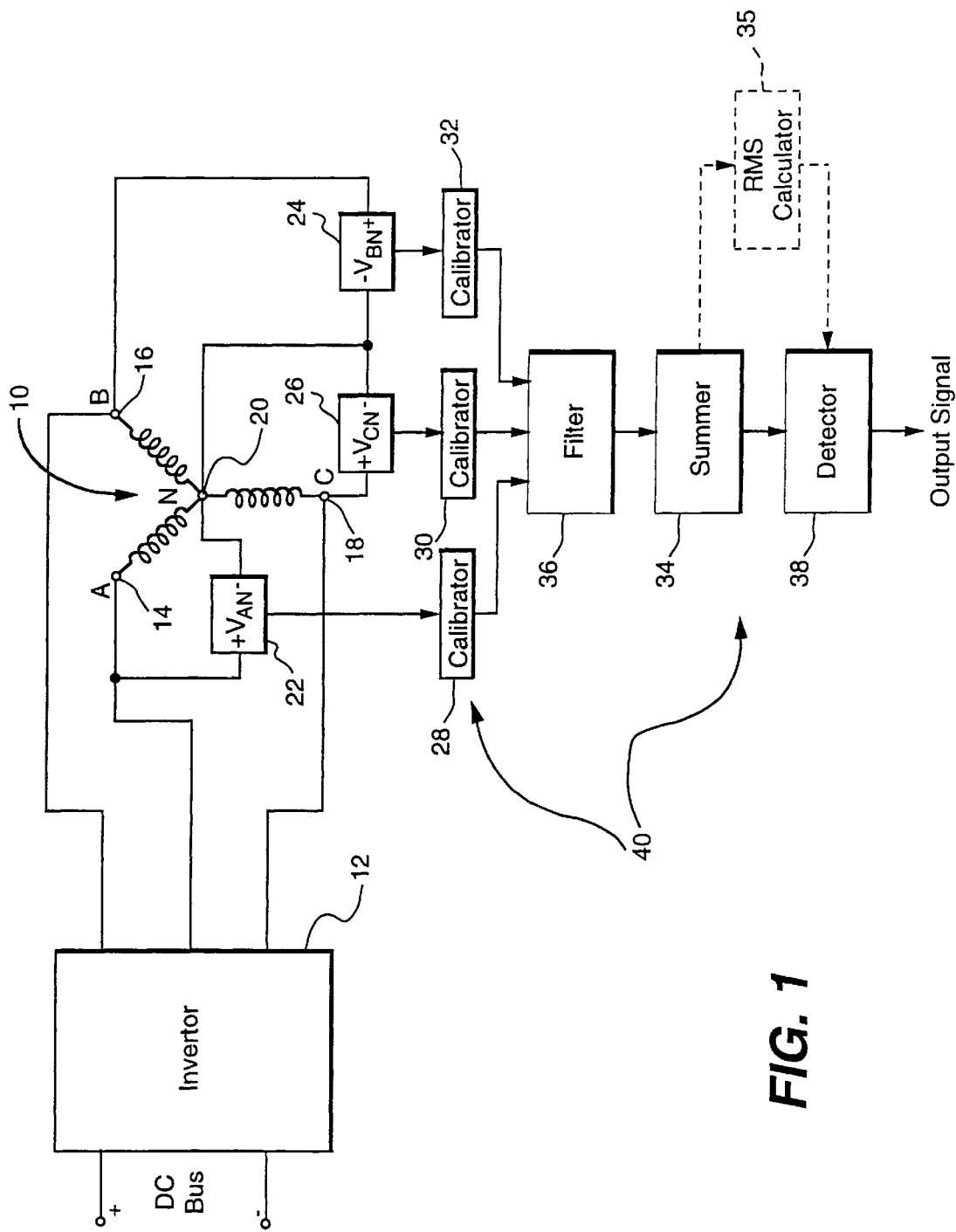
FIG. 1 is a block diagram of one embodiment of the present invention.

The present invention is applicable to multi-phase AC machines, whether synchronous or asynchronous. A three-phase induction motor is described below for purposes of example.

FIG. 1 is a block diagram of a three-phase induction motor 10 which is driven by an inverter 12. The motor of FIG. 1 has a wye (Y) configuration with a phase A line 14, a phase B line 16, a phase C line 18, and a neutral 20. The phase A line-to-neutral voltage is measured by voltage detector 22, the phase B line-to-neutral voltage is measured by voltage detector 24, and the phase C line-to-neutral voltage is measured by voltage detector 26.

Each of the measured voltages can be passed through respective calibrators 28, 30, and 32 before being filtered by filter 36 and summed by summer 34. Although three calibrators are shown, a single calibrator can be used for all three measurements, particularly if the measured voltages are transformed to digital signals. Similarly, although a single filter is shown, if preferred, three separate filters can be used. Furthermore, if desired, the measured voltages can be filtered prior to being calibrated. The summed signal is transmitted to a detector 38 for analysis. The calibrators, the filter, the summer, and the detector, each of which can be analog or digital and have an associated converter if needed, may collectively comprise an analog and/or digital computer 40.

When considering only the fundamental component of electrical excitation, the sum of the line-neutral voltages is given by the phasor relationship:

$$\tilde{V}_{sum} = \tilde{V}_a + \tilde{V}_b + \tilde{V}_c = Z_a \tilde{I}_a + Z_b \tilde{I}_b + Z_c \tilde{I}_c, \qquad (1)$$

wherein $\tilde{V}_{sum}$=sum of line-to-neutral voltages $\tilde{V}_a$=phase A line-to-neutral voltage $\tilde{V}_b$=phase B line-to-neutral voltage $\tilde{V}_c$=phase C line-to-neutral voltage
$Z_a$=phase A sequence impedance
$Z_b$=phase B sequence impedance
$Z_c$=phase C sequence impedance
$\tilde{I}_a$=phase A current
$\tilde{I}_b$=phase B current
$\tilde{I}_c$=phase C current.

The "~" symbol represents a phasor (complex quantity). For a balanced machine, the three-phase sequence impedances are equal:

$$Z_a = Z_b = Z_c. \tag{2}$$

In a three-wire (floating neutral) connection, the sum of the phase current is zero:

$$\tilde{I}_a + \tilde{I}_b + \tilde{I}_c = 0. \tag{3}$$

For a balanced machine, therefore, the sum of the phase voltages should be zero:

$$\tilde{V}_a + \tilde{V}_b + \tilde{V}_c = 0. \tag{4}$$

Equation (4) is true at any frequency, so, if the motor exhibits linear impedances, equation (4) can be extended to instantaneous voltages as follows:

$$v_{sum}(t) = v_a(t) + v_b(t) + v_c(t) = 0, \tag{5}$$

wherein
t=time
$v_{sum}(t)$=sum of instantaneous phase voltages
$v_a(t)$=phase A instantaneous line-to-neutral voltage
$v_b(t)$=phase B instantaneous line-to-neutral voltage
$v_c(t)$=phase C instantaneous line-to-neutral voltage.

In the present invention instantaneous line to neutral voltages are calibrated by calibrators 28, 30, and 32 and summed by summer 34, and deviations of equation (5), wherein $$v_{sum}(t) \neq 0, \tag{6}$$

reveal potential phase imbalance caused by turn faults.

Perfect phase balance is not achieved by real machines, and a residual value of $v_{sum}(t)$ will be present. If the magnitude of $v_{sum}(t)$ exceeds a predetermined threshold, a potential turn fault is indicated. Either an alarm or an automatic machine shut down is then initiated. The predetermined threshold will depend on the expected amount of noise and other instrumentation variations. The threshold must be high enough to prevent false alarms and low enough to detect turn faults and will best be selected after experimentation.

To reduce the effects of noise, an option is to examine deviations in a time-averaged function of the sum of instantaneous phase voltages. In this embodiment, instead of sending the sum directly to the detector 38, the summer 34 sends the sum to RMS calculator 35 which calculates the RMS value and supplies the RMS value to the detector. The RMS value can be calculated as follows:

$$V_{sum,rms}(t, T) = \sqrt{\frac{1}{T} \int_{t_o}^{t_o+T} (v_{sum}(t))^2 dt}, \tag{7}$$

wherein
T=the averaging period
$V_{sum,rms}(t, T)$=is the time averaged value of the sum of instantaneous phase voltages.

The averaging period affects the sensitivity by the level of smoothing of the output signal. For maximum sensitivity, the value of T can be chosen to be the period of the fundamental.

For a more continuous averaging calculation, equation (7) can be modified by using an exponentially-weighted function as follows:

$$V_{sum,rms}(t, \tau) = \int_0^t e^{-\frac{(t-s)}{\tau}} (v_{sum}(s))^2 ds, \tag{8}$$

wherein
$\tau$=the exponential time constant
s=a "dummy" variable for the continuous averaging calculation.

One method for efficiently approximating equation (7) or (8) is to use an analog multiplier to square the respective $v_{sum}(t)$ or $v_{sum}(s)$ and then supply the resulting output signal to an RC low pass filter.

As discussed above, perfect phase balance is not achieved by real machines, and residual values of the continuously averaged calculations of equations (7) and (8) will be present. Again, if the magnitude exceeds a predetermined threshold, a potential turn fault is indicated, and either an alarm or an automatic machine shut down is initiated with the predetermined threshold depending on the expected amount of noise and other instrumentation variations Because this technique does not rely upon accurate calculation of voltage and current phasors, it requires less processing power and is less sensitive to potential error magnification arising from extensive digital computations than schemes which depend on sequence component calculations. Additionally, this technique requires only a one-time simple calibration of the phase voltages and does not require an extensive learning stage (which often includes machine load as a variable). Moreover, because this technique does not require the measurement or use of phase currents, it requires fewer sensors and less processing power than prior methods which use both phase currents and phase voltages.

Machine load theoretically affects each phase impedance equally, and therefore $V_{sum}$ is inherently insensitive to changes in the average value of the motor load. However, in practice, each phase impedance varies significantly, but equally, with load. For this reason, the amount of change in $V_{sum}$ which would reflect a turn fault is load-dependent. Although the load directly affects the sensitivity (the signal level), it does not affect the accuracy of the present invention. In addition to load-variation immunity, the method of the present invention of turn fault detection has a similar benefit with regard to unbalanced source voltages due to excitation variations in and between the phases, whether they are characterized by varying magnitudes, angles, frequency content, or generalized distortion and noise.

In an actual machine, the perfect phase balance addressed by equation (2) is not achieved, resulting in a residual value of $V_{sum,rms}$. The origin of the residual value can either be a true impedance imbalance or an apparent impedance imbalance cause by phase impedance non-linearity or by signal conditioning equipment or instrumentation variances.

One particular source of phase impedance non-linearity stems from mechanical vibrations which modulate the geometry of the stator-rotor air gap and thus its distributed reluctance. These impedance variations are a function of the vibration frequency, among other factors. Other sources of phase impedance non-linearity include slot harmonics and inverter harmonics.

The primary source of phase impedance non-linearity can generally be traced to stator core magnetic saturation. Magnetic saturation of the core causes a non-linearity in the magnetizing and leakage reactances and is evidenced by characteristic harmonics present on all three line-to-neutral phase voltages. Because the dominant third harmonic is synchronized with the fundamental, it is zero sequence, and thus appears in $V_{sum,rms}$ at a magnitude of three times the phase value. However, as long as the motor is symmetrical, no fundamental component should be present. When there is a fault, the symmetry is broken, and there will be a fundamental frequency component in the sum voltage which can be used as an indication for stator turn-to-turn faults.

Because the saturation of the core depends upon the phase currents and the phase currents depend upon the mechanical load, this third harmonic present in $V_{sum,rms}$ depends upon the machine load. This third harmonic can be removed from $V_{sum,rms}$ by appropriate filtering of the measured voltages using filter 36. Filter 36 may comprise a fixed or variable frequency low pass filter, a fixed or variable frequency band bass filter, or a combination of a low pass filter and a band pass filter.

A low pass filter can be used to remove noise, inverter harmonics, slot harmonics, and third harmonics caused by saturation. A fixed filter drop off frequency can be selected to be slightly above the maximum frequency at which the motor is expected to run. A variable filter can be implemented with a switched capacitor, for example, to have a drop off frequency slightly above the frequency at which the motor is currently running. If a switched capacitor filter is used as the variable filter, compensation must be provided for the noise which such capacitors introduce. In the present invention, "slightly above" means less than or equal about twenty (20) percent above the particular frequency. The most appropriate drop off frequency for a particular application will vary according to the application and the sharpness of the filter which will be used and is best determined by experimentation.

Bandpass or notch filtering of the measured voltages around the fundamental frequency of machine excitation results in removal of the third harmonic and a maximum signal-to-noise ratio. If the band pass filter has a variable frequency setting, appropriate operation from a variable fundamental frequency can be maintained.

Instrumentation differences and signal conditioning variances can be compensated with calibrators 28, 30, and 32 by adjusting the signals which represent the source voltage magnitudes to obtain a minimum value of each measured voltage and thus a minimum value of $V_{sum,rms}$. In one embodiment, the calibrators comprise potentiometers, and the adjustment is performed manually with the potentiometers acting to remove an inherent machine phase impedance imbalance. Alternatively, a self-adjusting technique involving a modification of automatic gain control can be incorporated in an analog or digital realization that would represent learning the inherent motor phase impedance unbalance and instrumentation hardware differences. In other words, there exists some values of $\alpha_a$, $\alpha_b$, and $\alpha_c$ such that $$\alpha_a Z_a \bar{I}_a + \alpha_b Z_b \bar{I}_b + \alpha_c Z_c \bar{I}_c = 0, \quad (9)$$

whether $\alpha_a$, $\alpha_b$, and $\alpha_c$ are real, complex and/or time-varying. In one embodiment, real numbers for $\alpha_a$, $\alpha_b$, and $\alpha_c$ are chosen to correspond to the setting of precision potentiometers. This self-adjusting technique can be performed at infrequent intervals while the motor is in a known "healthy" or reference state.

Although the present invention has been described for an embodiment wherein the neutral is floating, the invention can also extend to a four-wire, machine-neutral-grounded operation, albeit with significant performance compromises. For example, there would be decreased immunity to source voltage imbalance and noise, along with emergent dependence upon baseline supply equivalent-impedance magnitudes and variations. In such four-wire connections, false alarms may occur due to connection or removal of other line loads as they may disturb source impedance balance that would otherwise be compensated by the floating machine neutral. Nearby single-phase loads are extremely prone to inflict these false alarms.

The present invention will work in both fixed frequency sine wave excitation or inverter excitation as long as the motor is wye connected and the center of the wye is accessible. The implementation can be analog and/or digital depending on the more convenient control technique for the filter. It is expected that analog filtering followed by conversion to digital values for signal analysis will yield the highest resolution.

EXPERIMENT

A 10 horse power, 230 volt alternating current wye-connected induction machine with its neutral accessible at the terminals was used to test the present invention. The machine had four available taps, one turn apart, on one of the stator phases (not shown), and each stator phase included 144 series single strand turns (not shown). Three standard 60 hertz miniature transformers (used for isolation) stepped down the terminal voltages to an acceptable level. The three low-voltage signals, each proportional to the respective line-to-neutral voltage, were low-pass filtered (for anti-aliasing purposes in the digital implementation) and were subsequently attenuated and balanced using precision potentiometers before they entered a plug-in data acquisition printed circuit board operating under the control of a customized C++ program. The program was used to perform the real time calculations of continuous voltage summation and bandpass filtering while saving and displaying the results in real time. Data was taken under machine no-load conditions and the turn faults were significant turn faults having minimal impedance.

The sum $v_{sum}(t)$ of instantaneous three-phase-neutral voltages was graphed and a detectable effect was found to coincide with a fault introduced into phase B of the motor. This effect became more pronounced (the sensitivity/signal magnitude increased) with digital removal of the third harmonic. Sensitivity became even higher when deviations $V_{sum,rms}(t, T)$ in a time-averaged function of the sum of instantaneous values were plotted with the third harmonic removed. Fault detection capability was maximized upon depiction of only the fundamental components of $v_{sum}$ and $V_{sum,rms}$ (that is, when the voltage measurements were bandpass filtered around the fundamental).

As discussed above, sensitivity varies with load. It was observed that a slight signal can be created by changes in machine loading—an undesirable effect that is likely attributable to varying degrees of saturation between the phases, but nonetheless, insignificant with regard to the true signal level coming from a turn fault. If and when a machine is loaded to stall, however, non-linear effects are expected to significantly obscure an otherwise detectable turn fault.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for turn fault detection in a multi-phase alternating current induction machine comprising:

obtaining line-to-neutral voltages from each phase of the induction machine;

continuously calculating a sum of the line-to-neutral voltages; and using the sum to determine whether a turn fault exists.

2. A turn fault detector for a multi-phase alternating current induction machine comprising:

sensors for sensing line-to-neutral voltages from each phase of the induction machine; and a computer for continuously calculating the sum of the line-to-neutral voltages and using the sum to determine whether a turn fault exists.

* * * * *

UNITED STATES PATENT AND TRADEMARK OFFICE
CERTIFICATE OF CORRECTION

PATENT NO. : 6,236,227 B1
DATED : May 22, 2001
INVENTOR(S) : Gerald B. Kliman et al.

It is certified that error appears in the above-identified patent and that said Letters Patent is hereby corrected as shown below:

<u>Title page,</u>
The inventorship should be corrected as follows:
Gerald Burt Kliman, Niskayuna, NY (US)
Thomas Gerard Habetler, Snellville, GA (US)

<u>Inventors,</u>
Please delete the name of Marcus Alex Cash as an inventor

Signed and Sealed this

Thirteenth Day of November, 2001

Attest:

NICHOLAS P. GODICI
Attesting Officer      Acting Director of the United States Patent and Trademark Office

UNITED STATES PATENT AND TRADEMARK OFFICE
CERTIFICATE OF CORRECTION

PATENT NO. : 6,236,227 B1
DATED : May 22, 2001
INVENTOR(S) : Gerald B. Kliman et al.

It is certified that error appears in the above-identified patent and that said Letters Patent is hereby corrected as shown below:

Title page,
Item [75], Inventors, should be corrected as follows:
-- Gerald Burt Kliman, Niskayuna, NY (US)
   Thomas Gerard Habetler, Snellville, GA (US) --

Signed and Sealed this

Twenty-ninth Day of June, 2004

JON W. DUDAS
*Acting Director of the United States Patent and Trademark Office*